United States Patent
Jacobson

(10) Patent No.: US 7,436,197 B1
(45) Date of Patent: Oct. 14, 2008

(54) VIRTUAL TEST HEAD FOR IC

(75) Inventor: Steven Jacobson, Dublin, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 169 days.

(21) Appl. No.: 10/950,285

(22) Filed: Sep. 23, 2004

(51) Int. Cl.
*G01R 31/26* (2006.01)

(52) U.S. Cl. .................. 324/765; 324/158.1

(58) Field of Classification Search ......... 324/760–765, 324/158.1, 73.1; 702/120–127; 714/724–733
See application file for complete search history.

(56) References Cited

U.S. PATENT DOCUMENTS

| | | | | |
|---|---|---|---|---|
| 4,504,783 A * | 3/1985 | Zasio et al. | .................. | 324/754 |
| 5,126,657 A * | 6/1992 | Nelson | ........................ | 324/761 |
| 6,275,962 B1 * | 8/2001 | Fuller et al. | .................. | 714/724 |
| 6,393,591 B1 * | 5/2002 | Jenkins et al. | .............. | 714/725 |
| 6,563,298 B1 * | 5/2003 | Creek et al. | .............. | 324/158.1 |
| 7,007,212 B2 * | 2/2006 | Komatsu et al. | ............ | 714/724 |
| 7,058,535 B2 * | 6/2006 | Chenoweth et al. | ......... | 702/118 |
| 7,242,209 B2 * | 7/2007 | Roberts et al. | .............. | 324/765 |
| 2003/0101395 A1 * | 5/2003 | Man et al. | .................... | 714/726 |
| 2003/0105607 A1 * | 6/2003 | Jones et al. | .................. | 702/121 |
| 2003/0196139 A1 * | 10/2003 | Evans | .......................... | 714/25 |
| 2004/0059970 A1 * | 3/2004 | Wieberdink et al. | ......... | 714/724 |
| 2005/0034019 A1 * | 2/2005 | Mayer et al. | ................... | 714/25 |
| 2005/0066231 A1 * | 3/2005 | Szucs et al. | .................... | 714/25 |
| 2005/0174131 A1 * | 8/2005 | Miller | ......................... | 324/754 |
| 2005/0253617 A1 * | 11/2005 | Roberts et al. | .............. | 324/765 |

* cited by examiner

*Primary Examiner*—Vinh P Nguyen
(74) *Attorney, Agent, or Firm*—Jurgen Vollrath

(57) ABSTRACT

In a test system for a semiconductor device, the device under test (DUT) is remotely located relative to the tester that generates the test vector signals. The tester and remotely located DUT are connected by a serial connection and each includes a serializer-deserializer for converting outgoing data to serial form and deserializing incoming data.

5 Claims, 2 Drawing Sheets

VIRTUAL TEST HEAD FOR IC

FIELD OF THE INVENTION

The invention relates to the testing of semiconductor devices.

BACKGROUND OF THE INVENTION

It is common in the semiconductor field to test and analyze defective chips in order to pinpoint the cause of a problem. Various types of failure analysis (FA) tools have been developed to examine/inspect the device under test (DUT) and pinpoint the location or region on the DUT where the problem occurs from photon emission or secondary electron acquisition or physical probing, etc. For example, some FA tools known in the art include EMMI (Emmission Microscopy), pico-probe stations, IDS (electron beam prober) and sem (electron microscope). While the DUTs are physically being viewed by one of these tools, the FA tools require physical access to the DUT for purposes of viewing the die surface and, in the case of a pico-probe station, to physically probe the DUT. This examination of the DUT is therefore done in a lab where the FA tools are located.

However, in addition to evaluating the DUT by physically inspecting the regions of the chip while signals are applied to the DUT, faults in a DUT are also pinpointed by simply applying signals to the pins or certain test nodes on the DUT and analyzing the output signals from the output pins of the chip. This type of analysis is thus purely electrical in nature and involves the generation of test vector pattern data that is fed into the chip. The test vectors are applied to the chip by a tester, which is depicted in the system block diagram of FIG. 1 by reference numeral 100. Typically the program that comprises the test vector pattern is loaded from a server 102 where the program is stored, and access is commonly provided to a user (the test engineer) at a client station 104 (typically a personal computer (PC)) The tester 100 is provided with a test head, which includes a motherboard 108 with a socket 106 for supporting the DUT. The test head typically contains a high speed DRAM buffer for loading input data and output data. The DUT 110 is shown in FIG. 1, mounted in the socket 106. In the case of a packaged device with 18 I/O or clock pins, 18 electrical connections will typically have to be made between the mother board 108 and the socket 106 on which the device under test 110 (DUT) is mounted. Output data from the output pins of the DUT is sent to the tester 100 and can be analyzed by the user at the client 104, which is connected to the tester 100, typically via an intranet connection.

In practice, the tester on which the DUT is mounted is commonly placed on top of the FA tool (e.g. in the case where the DUT has to be placed in a vacuum chamber of the FA tool) or in close proximity to the FA tool (e.g., in the case where the FA tool comprises a microscope for viewing the DUT). One such FA tool/tester combination is shown in FIG. 2, which shows a tester 200 with its motherboard, 202 and socket 204, supporting a DUT 206. Mounted over the tester 200 is an FA tool 210 in the form of a microscope. This close proximity causes problems for the analysis done using the FA tool since, the tester with its many data lines and cooling equipment causes a fair amount of vibration, which interferes with the FA tool analysis. In fact, it is not uncommon for a DUT to have many more than just 18 pins. Typical testers may have sockets with 512, 756, or 1024 I/O pins and an equivalent number of data lines between the motherboard and the socket.

The present invention seeks to address this problem.

Furthermore, even if the test engineer who ultimately performs the test is remotely located at a client station such as client 104 shown in FIG. 1, the systems known in the art still require a person to be present in the lab to place the DUT in the tester even in the absence of FA tool analysis, if the DUT is simply being electronically tested using test vectors.

The present invention seeks to provide a more convenient solution in cases where chips are tested purely electronically by means of test vector pattern data.

SUMMARY OF THE INVENTION

According to the invention, there is provided a method of testing a semiconductor device (DUT) comprising, separating the DUT from the tester and mounting the DUT remotely on a virtual tester, which may be located in the test engineer's office. The tester, which is typically still located in a lab, includes a first adaptor means for communicating with the remote DUT via a second adaptor means. The tester may still includes a test head with a motherboard having a socket. However, instead of placing the DUT in the socket of the motherboard, the socket now receives the first adaptor means. The first adaptor means may include an adaptor board mountable on the socket. The adaptor board preferably includes a serializer-deserializer (SERDES) for serially transmitting test vector pattern data to the remotely located second adaptor means and for serially receiving output data from the DUT. The remotely located DUT is, in turn, mounted on the second adaptor means (which typically also includes a serializer-deserializer (SERDES)) for serially receiving and transmitting information with the first adaptor means.

Accordingly the invention includes a method of testing a semiconductor device (DUT) using a tester, comprising locating the DUT at a location remote from the tester, and providing communication means for the tester and the DUT for transferring information between the tester and the DUT. Typically the information transferred from the tester to the DUT is test vector pattern data, and the information transferred from the DUT to the tester is output data from output pins of the DUT. The tester and DUT may be connected by an intranet or Internet connection, and providing the communication means typically includes providing a first serializer-deserializer (SERDES) located at the tester and providing a second SERDES located at the DUT. The tester may include a motherboard with a socket, wherein the method includes mounting the first SERDES on the socket of the motherboard. The DUT and second SERDES may, in turn, be mounted on a printed circuit board, wherein the printed circuit board may include a socket for mounting the second SERDES.

Further, according to the invention, there is provided a method of reducing vibration to a DUT being evaluated by a failure analysis tool while signals are provided to the DUT by a tester, comprising placing the tester sufficiently far from the failure analysis tool to eliminate or significantly reduce the vibration, and communicating serially between the tester and the DUT.

Still further, according to the invention, there is provided a tester for testing semiconductor devices, comprising a test vector generator and a data communication means, wherein the data communication means includes a SERDES for converting test vector pattern data generated by the tester to serial form for serial transmission to a remotely located DUT and for deserializing DUT output data received from the remote DUT. Typically the tester is connected to the DUT by a serial connection such as an intranet or the Internet.

Still further, according to the invention, there is provided a virtual test head, which comprising means for mounting a DUT and means for deserializing incoming test vector pattern data and serializing outgoing data from the output pins of the DUT. The virtual test head may also include circuitry for selectively tri-stating lines to the pins of the DUT. The virtual test head may also include circuitry for generating a clock signal and for selectively applying the clock signal to one or more of the pins of the DUT.

For purposes of this application, output pins includes pins that accommodate bidirectional data (bidirects). Also for purposes of this application I/O pins is used to refer to all I/O pins whether they are input, output or bidirects. The virtual test head may include a printed circuit board (PCB) and the SERDES is preferably mounted on the PCB. The tool may include a motherboard supporting a socket for mounting the PCB. The fault analysis tool may include any fault analysis tool known in the art such as EMMI, pico-probe station, IDS, sem, etc.

DETAILED DESCRIPTION OF THE INVENTION

Figure 1:
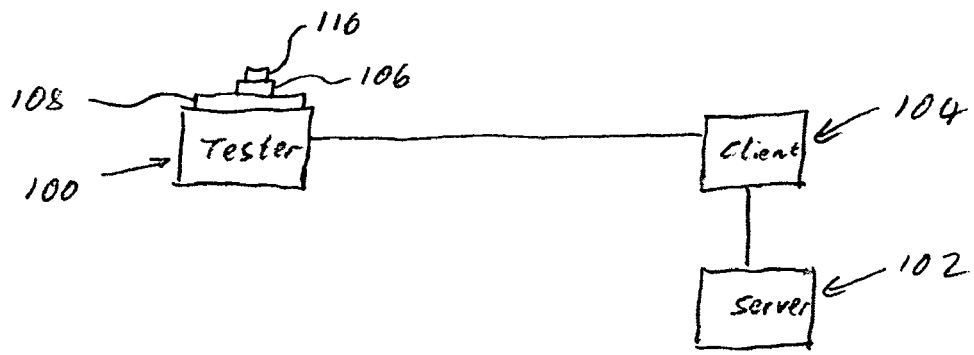
FIG. 1 is a block diagram of a prior art semiconductor test system.
Figure 2:
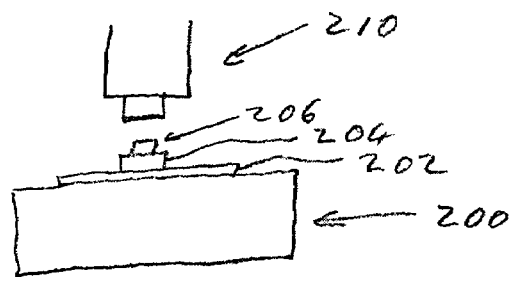
FIG. 2 shows a simple representation of an FA tool mounted over a tester.
Figure 3:
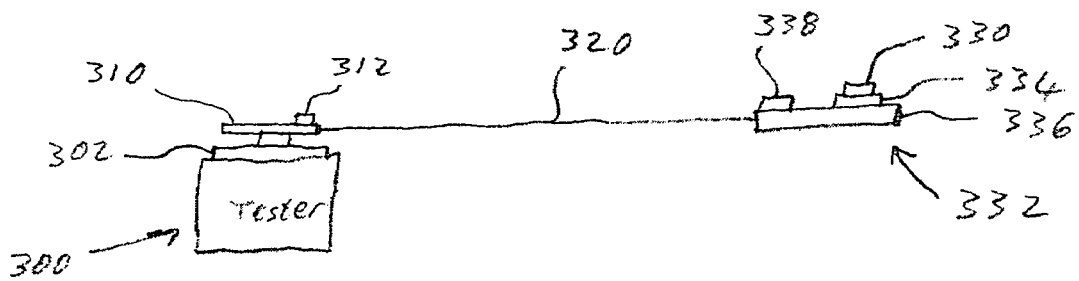
FIG. 3 is a block diagram of a test system in accordance with the invention.

FIG. 3 provides an overview of the test system in accordance with the present invention. In this case the tester 300 that provides the test vector signals to the motherboard 302 is located at a lab, which for convenience will be referred to as the local location. In this embodiment, the invention makes use of a test head that includes a motherboard 302 and socket 304 as known in the art. However, as is seen in FIG. 3, rather than mount a DUT in the socket 304, the DUT is separated from the tester 300 and, instead, an adaptor board 310 is provided that is adapted to be mountable on the socket 304. The adaptor board 310 defines a communication means for communicating with the remotely located DUT. In this embodiment the adaptor board 310 includes a serializer-deserializer (SERDES) 312. The SERDES converts test vector pattern data from the tester 300 to serial form for serial transmission over communications line 320 to the remotely located DUT.

As mentioned above one feature of the invention is that the DUT 330 is remotely located and electrically connected to a virtual test head 332, which is described in greater detail below. It will be appreciated that the physical DUT will need means for receiving test vector pattern data from the tester 300 and for transmitting data received at the output pins of the DUT, back to the tester 300. This is achieved in one embodiment by mounting the DUT 330 in a socket 334 that is mounted on a board 336 at the remote location. The board 336 is also provided with a SERDES 338, which receives serial test vector pattern data from the SERDES 312 and converts it to parallel form for the pins of the DUT 330. Parallel output data from the output pins of the DUT 330 are, in turn, converted by the SERDES 338 to serial form for transmission to the SERDES 312. Thus, one feature of the invention is that the tester 300 and virtual test head 332, in this embodiment, are connected by a serial connection 310 such as an intranet connection, e.g., Ethernet, or through an Internet connection. Thus, the physical communications line can be any line or cable, e.g., coaxial cable, twisted pair, fiber optic cable, etc., that constitutes part of an intranet or the Internet.

As mentioned above, the virtual test head 332, which physically supports the DUT 330 does so by means of a socket 334 mounted on a PCB 336. In this embodiment the socket 334 is a 1024 pin socket for supporting DUTs having up to 1024 pins. Since this embodiment contemplates use with a variety of DUTs with different I/Os, power supply pins and ground pins, additional circuitry is provided on the board 336 for tri-stating select lines depending on whether they are input pins or output pins in the case of a particular DUT. Also, the circuitry allows clocking signals to be selectively applied to one or more pins, as is described in greater detail below.

Figure 4:
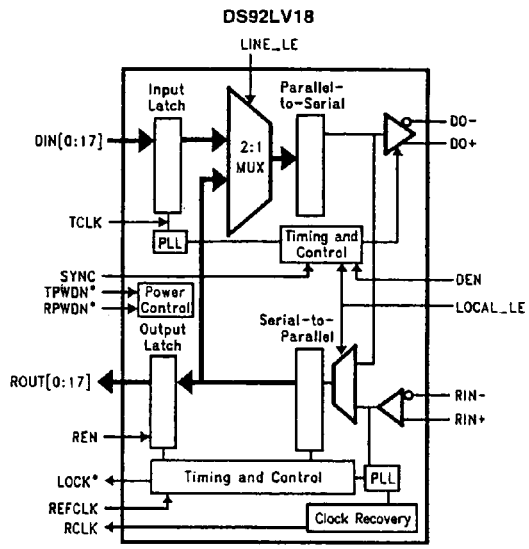
FIG. 4 is a diagram of one type of SERDES for use in the invention.

FIG. 4 shows a block diagram of one type of SERDES provided by National Semiconductor Corporation, the DS92LV18 which provides a 2.376 Gbps duplex throughput to support an 18 I/O pin device operating at 66 MHz. It will be appreciated that bandwidth limitations in the connection 320 will limit the testing speed since one bit of data for one pin is transmitted with each clock cycle. As the number of pins for the DUT increases to 1024 for instance, 1024 clock cycles are needed to provide the appropriate signals for all the pins for one test vector. It will, however, be appreciated that buffering of input data may be used to avoid retransmitting the same signal to a pin where the signal on that pin remains unchanged from one vector to the next.

Figure 5:
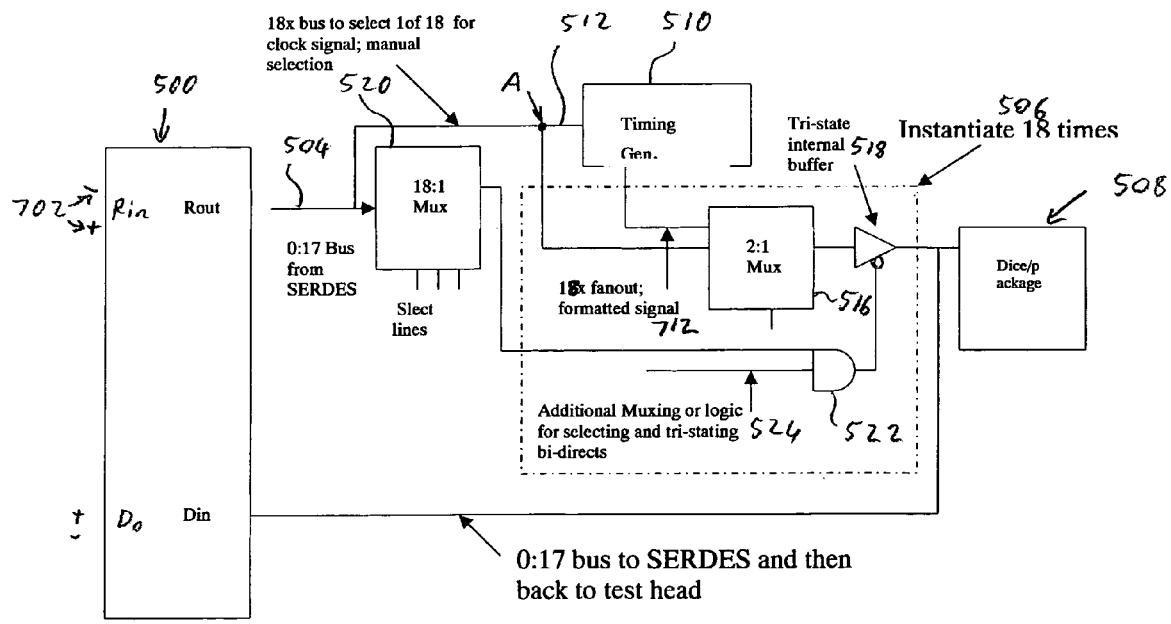
FIG. 5 is a simple circuit diagram of a support circuit of one embodiment of the invention for use with the SERDES of FIG. 4.

For ease of discussion an 18 I/O pin DUT will be considered. In order to allow output pins and select input/output pins of the DUT to be tri-stated, additional circuitry is provides between the SERDES and the DUT as shown in FIG. 5. Serial data comes into the SERDES 500 from positive and negative inputs 502 (since in this embodiment the serial connection 320 is twisted pair) and is deserialized onto an 18 line data bus 504. The 18 data or signal lines of the bus 504 are each provided with a control block 506 before each is fed to a separate pin of the DUT 508. In order to provide a clock signal to one or more pins of the DUT 508, one of the 18 data lines of bus 504, in this embodiment, is fed into a timing generator 510. The timing generator 510 could, for example, simply be a function generator that makes use of the edge trigger function of the function generator to generate a clock signal. The one data line 512 fed into the timing generator is, in this embodiment, manually selected. It will be appreciated that a separate 18:1 multiplexer could be included to allow the data line 512 to be selected.

As mentioned above, the control block 506 is instantiated 18 times (one for each data line of the bus 504. The bus 504 is split into 18 separate lines, e.g., at point A, and each line 514 is fed into its own 2:1 multiplexer 516. For each instantiation, the clock signal on line 512 forms the other input to the multiplexer 516. This allows either the data on the particular line 514 or the clock signal to be applied to a pin of the DUT 508. In order to allow the lines into the DUT to be tri-stated to avoid feeding signal into outputs of the DUT 508, each line feeding into the DUT 508 is provided with a tri-state buffer 518. Each buffer 518 is controlled by one of the data lines of the bus 704, as determined by a 18:1 multiplexer 520. Thus the multiplexer 520 allows individual lines of the bus 504 to be selected, which, in turn each control a tri-state buffer 512. The output from the multiplexer 520 is however first fed into an AND gate 522, which has as its other input a select signal 524, thereby controlling the throughput of the signal, in order to accommodate bidirects. The output from the AND gate is then used to control tri-state buffer 512.

While the above discussion dealt with 18 data lines and discussed only digital signals, the present invention is intended of DUTs with any number of I/Os and may also be used for analogue devices, in which the boards on either of the transmission would also include analog to digital (A/D) converters and digital to analog (D/A) converters. Also, as mentioned above, even though the above embodiment discussed serial transmission using twisted pair, any medium and any protocol could be adopted to transmit the serial data. For example, HTTP drivers could be used of transmission over the Internet.

It will be appreciated that the invention can be used to reduce and even avoid vibration from a tester while a DUT is being analyzed by a fault analysis (FA) tool. This is achieved by mounting the virtual test head relative to the FA tool and moving the tester some distance away or locating it in an entirely different room or building and simply communicating serially between the tester and the virtual test head.

In situations where the DUT is not being analyzed by an FA tool, the present invention provides the convenience that the test engineer no longer needs someone at the lab to place the DUT in the socket on the tester motherboard. Instead, the test engineer can have the virtual test head in his or her office, mount the DUT on the virtual test head and communicate serially with the tester, which could be located at a remote lab.

What is claimed is:

1. A method of testing a semiconductor device (DUT) using a tester, comprising
   locating the DUT in a first DUT socket mounted on a first board at a remote location remote from the tester, and
   providing communication means for serially communicating between the tester and the DUT for transferring information between the tester and the DUT, the tester including a second DUT socket and an adaptor board located remotely from the first board, the adaptor board being adapted to be mounted on the second DUT socket and including a serializer-deserializer (SERDES) as part of the communication means.

2. A method of claim 1, wherein the information transferred from the tester to the DUT is test vector pattern data, and the information transferred from the DUT to the tester is output data from output pins of the DUT.

3. A method of claim 2, wherein the tester and DUT are connected by an intranet or Internet connection.

4. A method of claim 3, wherein providing the communication means includes providing said serializer-deserializer (SERDES) located at the tester and providing a second SERDES located at the DUT.

5. A method of claim 4, wherein the first DUT socket for the DUT and the second SERDES are mounted on a printed circuit board.

* * * * *